United States Patent
Ishiduki et al.

(10) Patent No.: US 8,410,538 B2
(45) Date of Patent: Apr. 2, 2013

(54) SEMICONDUCTOR MEMORY DEVICE AND METHOD FOR MANUFACTURING SAME

(75) Inventors: Megumi Ishiduki, Mie-ken (JP); Yoshiaki Fukuzumi, Kanagawa-ken (JP); Ryota Katsumata, Mie-ken (JP); Masaru Kidoh, Mie-ken (JP); Masaru Kito, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/834,390

(22) Filed: Jul. 12, 2010

(65) Prior Publication Data

US 2011/0227140 A1  Sep. 22, 2011

(30) Foreign Application Priority Data

Mar. 17, 2010  (JP) ................. 2010-060803

(51) Int. Cl.
*H01L 29/66*  (2006.01)
(52) U.S. Cl. ................. 257/319; 257/E21.629; 438/257
(58) Field of Classification Search .................. 257/316, 257/319, E21.21, E21.629, E21.679; 438/257
See application file for complete search history.

(56) References Cited

U.S. PATENT DOCUMENTS

| | | | |
|---|---|---|---|
| 6,511,873 B2 * | 1/2003 | Ballantine et al. | 438/239 |
| 2007/0252201 A1 | 11/2007 | Kito et al. | |
| 2009/0146206 A1 | 6/2009 | Fukuzumi et al. | |
| 2009/0310425 A1 * | 12/2009 | Sim et al. | 365/185.29 |
| 2011/0129992 A1 * | 6/2011 | Jung | 438/587 |

FOREIGN PATENT DOCUMENTS

| | | |
|---|---|---|
| JP | 2008-186868 A | 8/2008 |
| JP | 2009-146954 | 7/2009 |
| JP | 2010-45149 A | 2/2010 |
| WO | 2009/075370 A1 | 6/2009 |
| WO | WO 2009/072984 A1 | 6/2009 |

OTHER PUBLICATIONS

U.S. Appl. No. 12/886,135, filed Sep. 20, 2010, Mizushima, et al.
U.S. Appl. No. 12/886,854, filed Sep. 21, 2010, Fukuzumi, et al.
U.S. Appl. No. 12/679,991, filed Mar. 25, 2010, Yoshiaki Fukuzumi, et al.
U.S. Appl. No. 13/227,882, filed Sep. 8, 2011, Mizushima, et al.
Office Action issued Jul. 30, 2012, in Japanese Patent Application No. 2010-060803 with English translation.

* cited by examiner

*Primary Examiner* — David Vu
(74) *Attorney, Agent, or Firm* — Oblon, Spivak, McClelland, Maier & Neustadt, L.L.P.

(57) ABSTRACT

According to one embodiment, a semiconductor memory device includes a substrate, a stacked body, a memory film, and a SiGe film. The stacked body includes a plurality of conductive layers and a plurality of insulating layers alternately stacked above the substrate. The memory film includes a charge storage film. The memory film is provided on a sidewall of a memory hole punched through the stacked body. The SiGe film is provided inside the memory film in the memory hole.

7 Claims, 10 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from Japanese Patent Application No. 2010-060803, filed on Mar. 17, 2010; the entire contents of which are incorporated herein by reference.

FIELD

Embodiments described herein relate generally to a semiconductor memory device and a method for manufacturing the same.

BACKGROUND

In a conventional nonvolatile semiconductor memory device (memory), elements are integrated in the two-dimensional plane on a silicon substrate. The dimension of one element is reduced (downscaled) to increase the storage capacity of the memory. However, such downscaling has recently become difficult in terms of cost and technology.

In this context, a collectively processed three-dimensional stacked memory has been proposed.

For instance, JP-A-2009-146954 discloses a technique for three-dimensionally arranging memory cells by forming memory holes in a stacked body in which a plurality of conductive layers functioning as control gates in the memory device are alternately stacked with insulating layers, forming a charge storage film on the inner wall of the memory hole, and then providing silicon in the memory hole. In this structure, the channel length along the stacking direction increases with the increase in the number of stacked layers.

DETAILED DESCRIPTION

According to one embodiment, a semiconductor memory device includes a substrate, a stacked body, a memory film, and a SiGe film. The stacked body includes a plurality of conductive layers and a plurality of insulating layers alternately stacked above the substrate. The memory film includes a charge storage film. The memory film is provided on a sidewall of a memory hole punched through the stacked body. The SiGe film is provided inside the memory film in the memory hole.

Embodiments will now be described with reference to the drawings.

Figure 1:
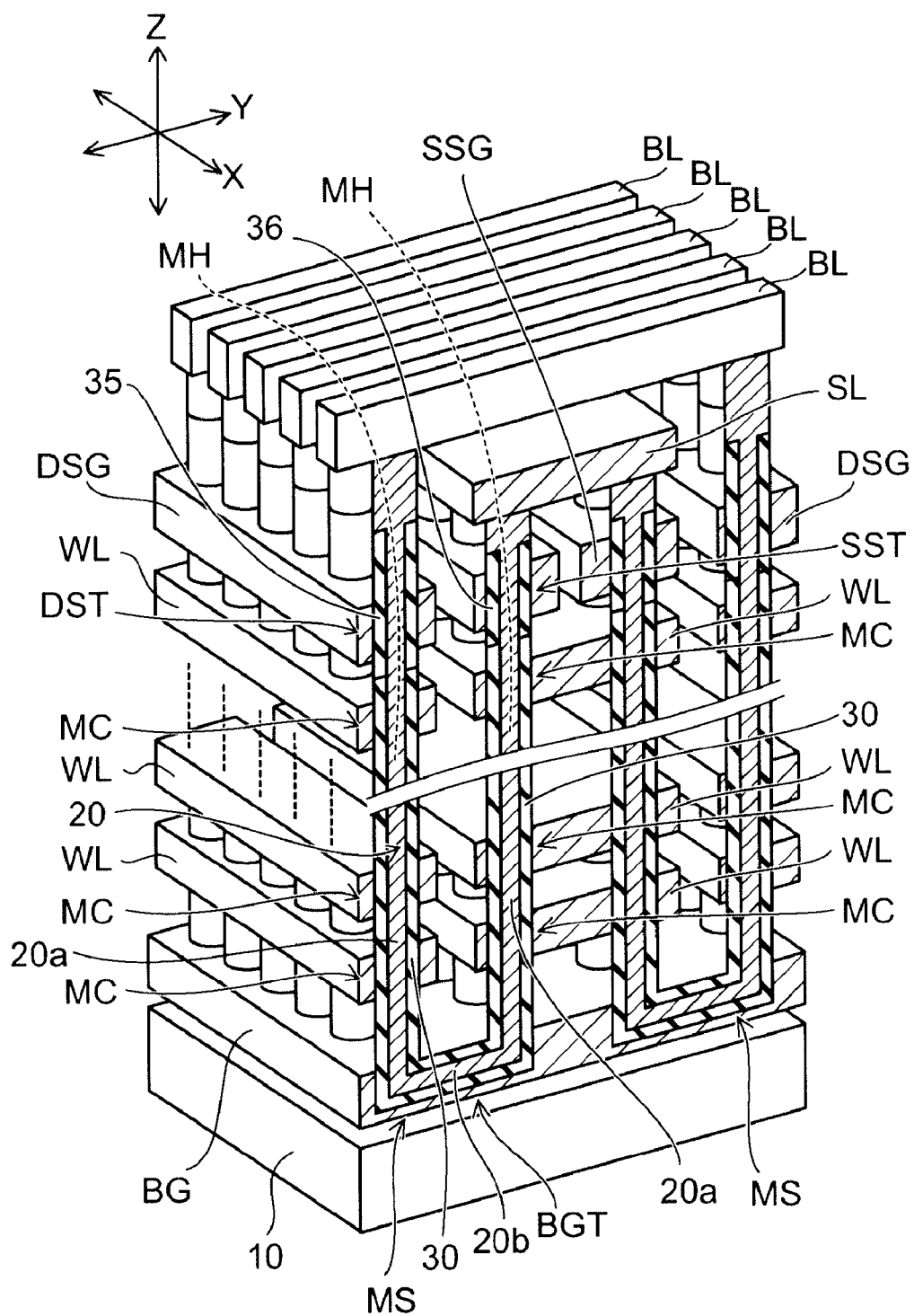
FIG. 1 is a schematic perspective view of a memory cell array in a semiconductor memory device according to an embodiment.
Figure 2:
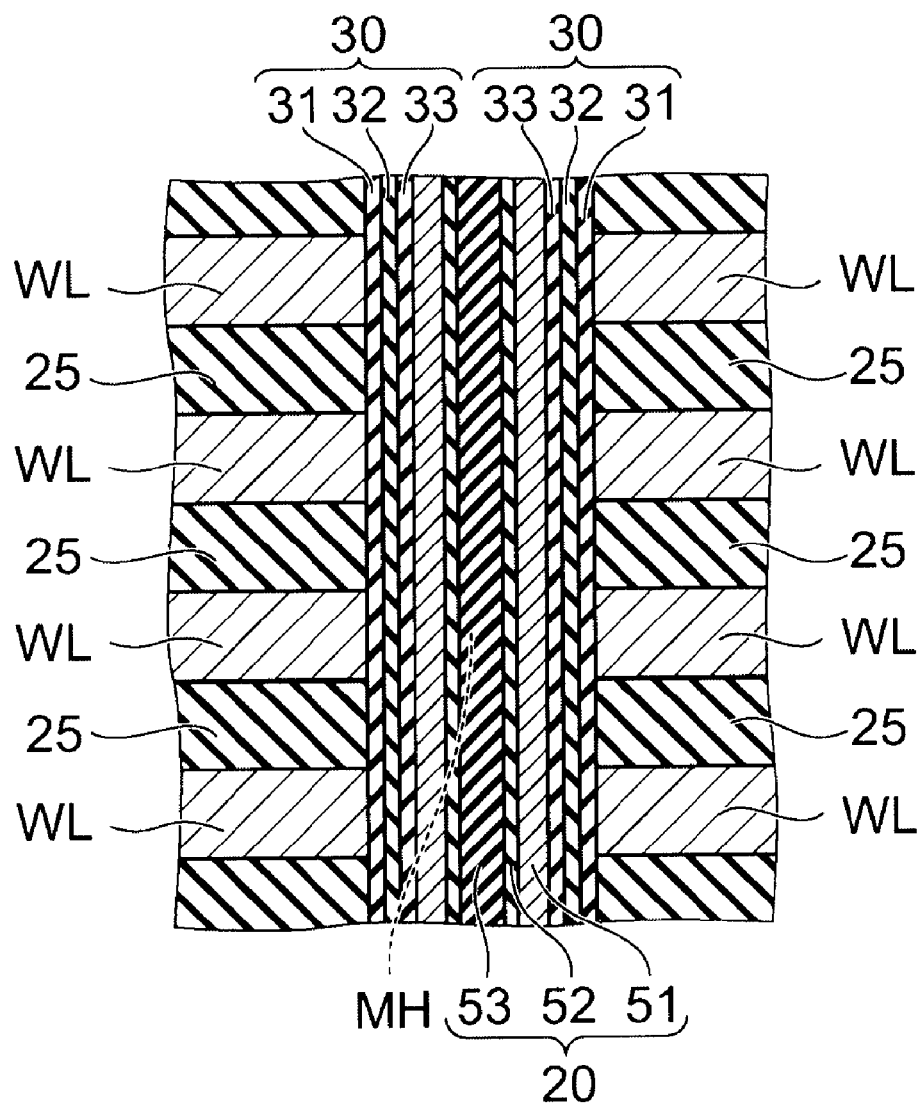
FIG. 2 is an enlarged cross-sectional view of the relevant part in FIG. 1.

FIG. 1 is a schematic perspective view of a memory cell array in a semiconductor memory device according to an embodiment. FIG. 2 is an enlarged cross-sectional view of the memory film 30 and the body 20 in FIG. 1. In FIG. 1, for clarity of illustration, the insulating portions except the memory film 30 are not shown.

In this specification, for convenience of description, an XYZ orthogonal coordinate system is introduced. In this coordinate system, the two directions parallel to the major surface of the substrate 10 and orthogonal to each other are referred to as X and Y direction, and the direction orthogonal to both the X and Y direction is referred to as Z direction.

A back gate BG is provided above the substrate 10 via an insulating layer, not shown. The back gate BG is a silicon layer provided with conductivity illustratively by impurity doping. A plurality of conductive layers WL and a plurality of insulating layers 25 (FIG. 2) are alternately stacked on the back gate BG. The conductive layer WL is a silicon layer provided with conductivity illustratively by impurity doping. The insulating layer 25 is illustratively a TEOS (tetraethoxysilane) layer containing silicon oxide. The number of conductive layers WL is arbitrary.

The stacked body including the conductive layers WL and the insulating layers 25 in the memory cell array region is divided into a plurality of blocks in the Y direction, and an insulator, not shown, is buried between the blocks.

A drain-side select gate DSG is provided via an insulating layer, not shown, above the uppermost conductive layer WL in one block. The drain-side select gate DSG is a silicon layer provided with conductivity illustratively by impurity doping. A source-side select gate SSG is provided via an insulating layer, not shown, above the uppermost conductive layer WL in another block neighboring the former block. The source-side select gate SSG is a silicon layer provided with conductivity illustratively by impurity doping. An insulating layer, not shown, is interposed between the drain-side select gate DSG and the source-side select gate SSG.

A source line SL is provided above the source-side select gate SSG via an insulating layer, not shown. The source line SL is a metal layer, or a silicon layer provided with conductivity illustratively by impurity doping. A plurality of bit lines BL are provided above the source line SL and the drain-side select gate DSG. Each bit line BL extends in the Y direction.

A plurality of U-shaped memory holes MH are formed in the aforementioned stacked body. A hole is formed in the block including the drain-side select gate DSG. The hole extends in the Z direction through the drain-side select gate DSG and the underlying conductive layers WL. A hole is formed in the block including the source-side select gate SSG. The hole extends in the Z direction through the source-side select gate SSG and the underlying conductive layers WL. These holes are connected to each other through a recess formed in the back gate BG as described later.

A U-shaped body 20 is provided inside the memory holes MH. A gate insulating film 35 is formed on the sidewall of the memory hole MH between the drain-side select gate DSG and the body 20. A gate insulating film 36 is formed on the sidewall of the memory hole MH between the source-side select gate SSG and the body 20.

A memory film 30 is formed on the sidewall of the memory hole MH between each conductive layer WL and the body 20. The memory film 30 is formed also on the inner wall of the memory hole MH between the back gate BG and the body 20. The memory film 30 illustratively has an ONO (oxide-nitride-oxide) structure in which a silicon nitride film is sandwiched between a pair of silicon oxide films.

As shown in FIG. 2, between each conductive layer WL and the body 20, a first insulating film 31, a charge storage film 32, and a second insulating film 33 are provided sequentially from the conductive layer WL side. The first insulating film 31 is in contact with the conductive layer WL, the second insulating film 33 is in contact with the body 20, and the charge storage film 32 is provided between the first insulating film 31 and the second insulating film 33.

The body 20 is buried inside the memory film 30 in the memory hole MH. The body 20 includes a SiGe (silicon germanium) film 51, a silicon oxide film 52, and an insulating core material 53 provided sequentially from the memory film 30 side. The insulating core material 53 is illustratively silicon nitride.

The SiGe film 51 functions as a channel, the conductive layer WL functions as a control gate, and the charge storage film 32 functions as a data storage layer for storing charge injected from the SiGe film 51. That is, at each intersection between the SiGe film 51 and the conductive layer WL is formed a memory cell having a structure in which the control gate surrounds the channel.

The semiconductor memory device according to this embodiment is a nonvolatile semiconductor memory device in which electrical erasure/writing of data can be freely performed and the stored content can be retained even after power off. For instance, the memory cell is one having a charge trap structure. The charge storage film 32 includes numerous traps for confining charges (electrons), and is illustratively a silicon nitride film. The second insulating film 33 is illustratively a silicon oxide film, and serves as a potential barrier when charge is injected from the SiGe film 51 into the charge storage film 32, or when the charge stored in the charge storage film 32 diffuses into the SiGe film 51. The first insulating film 31 is illustratively a silicon oxide film, and prevents the charge stored in the charge storage film 32 from diffusing into the conductive layer WL.

As shown in FIG. 1, the drain-side select gate DSG, the body 20 piercing the drain-side select gate DSG, and the gate insulating film 35 provided between this body 20 and the drain-side select gate DSG constitute a drain-side select transistor DST. The SiGe film 51 in the body 20 piercing the drain-side select gate DSG functions as a channel film of the drain-side select transistor DST. The upper end portion of the SiGe film 51 on the drain-side select gate DSG side is connected to the corresponding bit line BL.

The source-side select gate SSG, the body 20 piercing the source-side select gate SSG, and the gate insulating film 36 provided between this body 20 and the source-side select gate SSG constitute a source-side select transistor SST. The SiGe film 51 in the body 20 piercing the source-side select gate SSG functions as a channel film of the source-side select transistor SST. The upper end portion of the SiGe film 51 on the source-side select gate SSG side is connected to the source line SL.

The back gate BG, the body 20 provided in this back gate BG, and the memory film 30 constitute a back gate transistor BGT. The SiGe film 51 in the body 20 in the back gate BG is formed integrally with the SiGe film 51 formed along the stacking direction of the aforementioned stacked body and functions as a channel film of the back gate transistor BGT. The memory film 30 in the back gate BG functions as a gate insulating film of the back gate transistor BGT.

A plurality of memory cells MC, as many as the number of conductive layers WL each serving as a control gate, are provided between the drain-side select transistor DST and the back gate transistor BGT.

Likewise, a plurality of memory cells MC, as many as the number of conductive layers WL each serving as a control gate, are provided between the back gate transistor BGT and the source-side select transistor SST.

These memory cells MC, the drain-side select transistor DST, the back gate transistor BGT, and the source-side select transistor SST are series connected to constitute one U-shaped memory string MS. That is, the body 20 is formed into a U-shape, which includes a pair of pillar portions 20a extending in the stacking direction of the stacked body including a plurality of conductive layers WL, and a connecting portion 20b buried in the back gate BG and connecting between the pair of pillar portions 20a. A plurality of U-shaped memory strings MS are arranged in the X and Y direction, and thereby a plurality of memory cells MC are three-dimensionally provided in the X, Y, and Z direction.

To obtain the aforementioned structure, a memory film 30 is first formed on the sidewall of the memory hole MH, and then a channel film is formed on the sidewall of the memory film 30, which is an insulating film. Hence, single crystal silicon commonly used in a memory device having a structure in which a channel is formed in the substrate surface is difficult to form as a channel in the structure according to this embodiment.

In this context, there is a proposal for forming a polycrystalline silicon film, for instance, on the sidewall of the memory film 30 by the CVD (chemical vapor deposition) process. However, polycrystalline silicon has a lower carrier mobility than single crystal silicon because of trap levels due to crystal defects and scattering at crystal grain boundaries, and tends to have a lower on-current. Low on-current makes it difficult to read data.

On the other hand, in the case of increasing the number of stacked conductive layers WL to achieve further increase in capacity, as the channel along the stacking direction becomes longer, the value of the read current decreases. Thus, there is concern about decrease in the read speed with the increase in capacity.

Thus, in this embodiment, as described above, the SiGe film 51 is used as a channel film in the memory cell. In SiGe formed by the method described later, crystal defects can be reduced as compared with polycrystalline silicon. Thus, the channel resistance can be reduced to increase the on-current. Consequently, the current sensing sensitivity in data read can be increased.

For instance, the SiGe film 51 can be formed on the memory film 30 by the CVD process. However, the SiGe film formed by the CVD process may include many defect levels, and if it is directly used as a channel, the expected increase of the on-current may be insufficient.

Thus, in this embodiment, as described later, forming the SiGe film 51 is followed by the process for thermally oxidizing the memory hole central axis side of the SiGe film 51 to selectively oxidize only Si, thereby diffusing Ge (germanium) to the memory film 30 side of the SiGe film 51 to concentrate Ge on the memory film 30 side. Hence, the final Ge concentration in the SiGe film 51 is higher than the Ge concentration obtained by film formation by the CVD process. Furthermore, the Ge concentration is higher on the oxidized interface side on the memory hole central axis side than on the side of the interface with the memory film 30.

Si (silicon) is more stable when coupled to O (oxygen) than to Ge (germanium). Ge dissociated from coupling with Si diffuses to the memory film 30 side while terminating crystal defects in the SiGe film 51 and recrystallizing it. Thus, the portion of the SiGe film 51 on the memory film 30 side to function as a channel can be altered to polycrystalline SiGe with fewer defect levels and larger crystal size, so that a SiGe channel with higher mobility can be obtained.

Next, a method for manufacturing a semiconductor memory device according to the first embodiment is described with reference to FIGS. 3A to 6B.

Figure 3A:
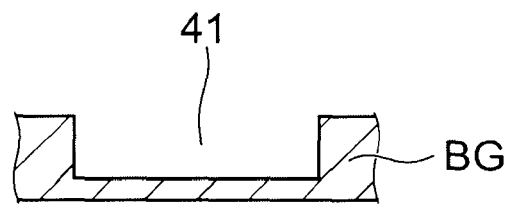
FIGS. 3A to 6B are schematic cross-sectional views showing a method for manufacturing a semiconductor memory device according to a first embodiment.
Figure 3B:
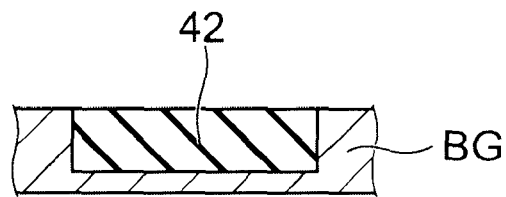

First, a back gate BG is formed above a substrate 10 via an insulating layer, not shown. Then, as shown in FIG. 3A, a recess 41 is formed in the back gate BG. Next, as shown in FIG. 3B, a silicon nitride film is illustratively buried as a sacrificial film 42 in the recess 41.

Figure 3C:
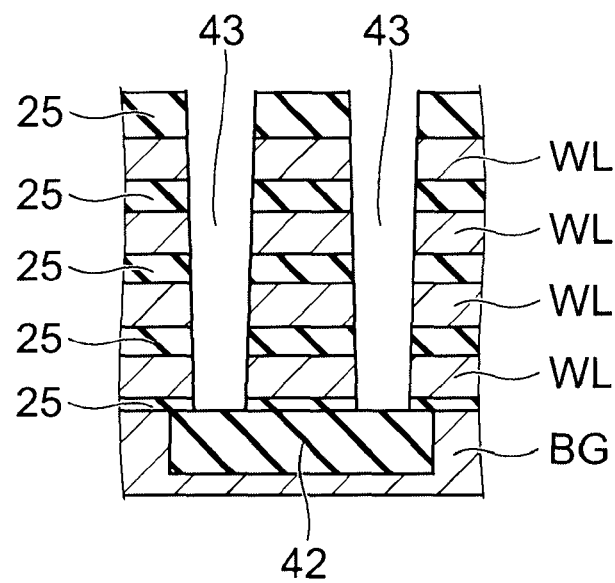

Next, a plurality of insulating layers 25 and a plurality of conductive layers WL are alternately stacked to form a stacked body on the back gate BG and the sacrificial film 42. Then, as shown in FIG. 3C, holes 43 punched through the stacked body to the sacrificial film 42 are formed. The insulating layer 25 and the conductive layer WL are formed illustratively by the CVD process. The hole 43 is formed illustratively by the RIE (reactive ion etching) process.

Figure 4A:
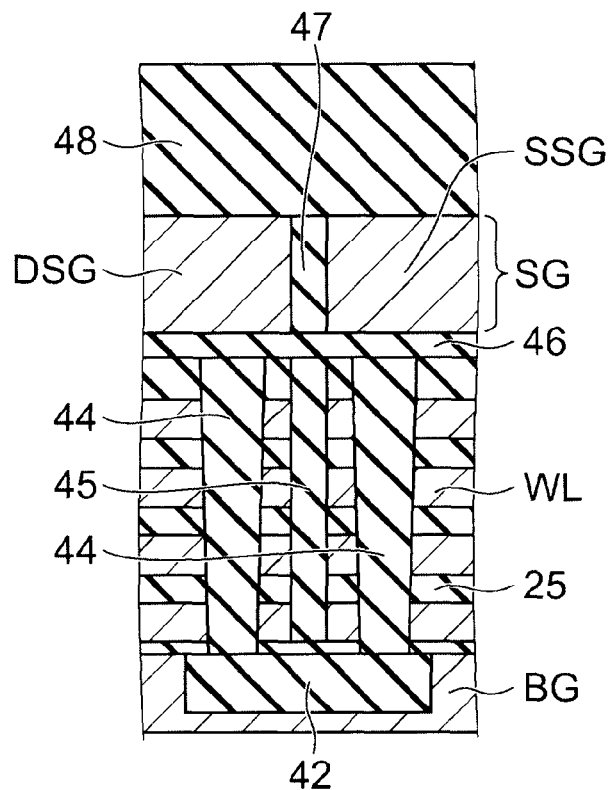

Next, as shown in FIG. 4A, a silicon nitride film is illustratively buried as a sacrificial film 44 in the hole 43. Subsequently, trenches are formed in the stacked body to divide the stacked body into a plurality of blocks, and an insulator 45 is buried in the trenches.

Next, a select gate SG is stacked above the stacked body via an insulating layer 46. The select gate SG is patterned and divided into a drain-side select gate DSG and a source-side select gate SSG. An insulating layer 47 is interposed between the drain-side select gate DSG and the source-side select gate SSG. Subsequently, an insulating layer 48 is stacked on the drain-side select gate DSG and the source-side select gate SSG.

Figure 4B:
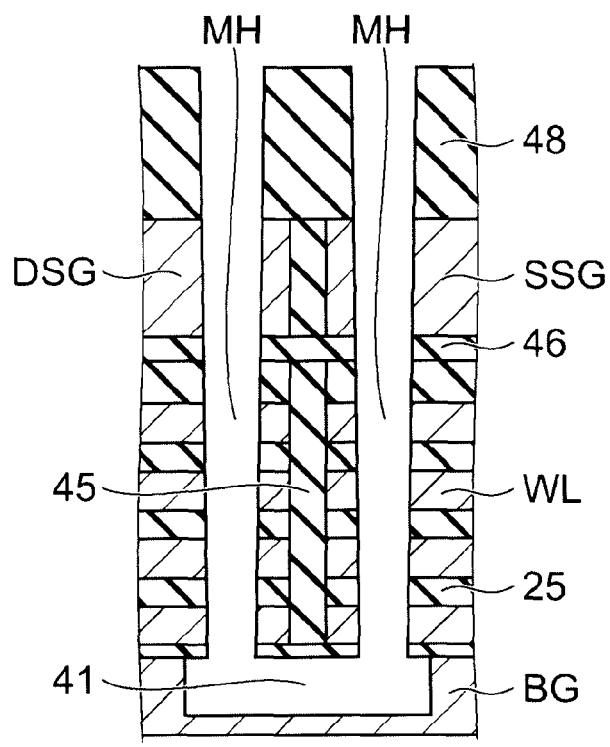

Next, holes punched through the insulating layer 48, the drain-side select gate DSG, the source-side select gate SSG, and the insulating layer 46 to the sacrificial film 44 are formed. Then, the sacrificial film 44 and the sacrificial film 42 are removed through the holes. Thus, as shown in FIG. 4B, a U-shaped memory hole MH is formed in the stacked body and the back gate BG.

Figure 5A:
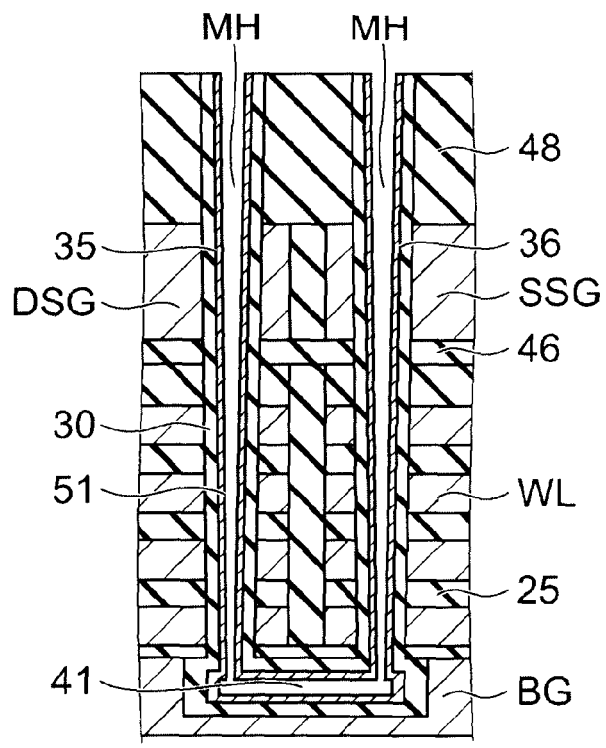

Next, as shown in FIG. 5A, a memory film 30 is formed on the inner wall of the memory hole MH illustratively by the CVD process. Subsequently, a SiGe film 51 is formed inside the memory film 30 in the memory hole MH illustratively by the CVD process. Here, a hollow portion is left inside the SiGe film 51 so that the memory hole MH is not filled with the SiGe film. By leaving a hollow portion in the memory hole MH, the inside of the SiGe film 51 can be exposed to an oxidizing atmosphere in the following process.

Next, the portion of the SiGe film 51 facing the hollow portion is altered to insulator by heat treatment. Specifically, thermal oxidization treatment is performed on the SiGe film 51 in an oxygen-containing gas atmosphere.

Figure 5B:
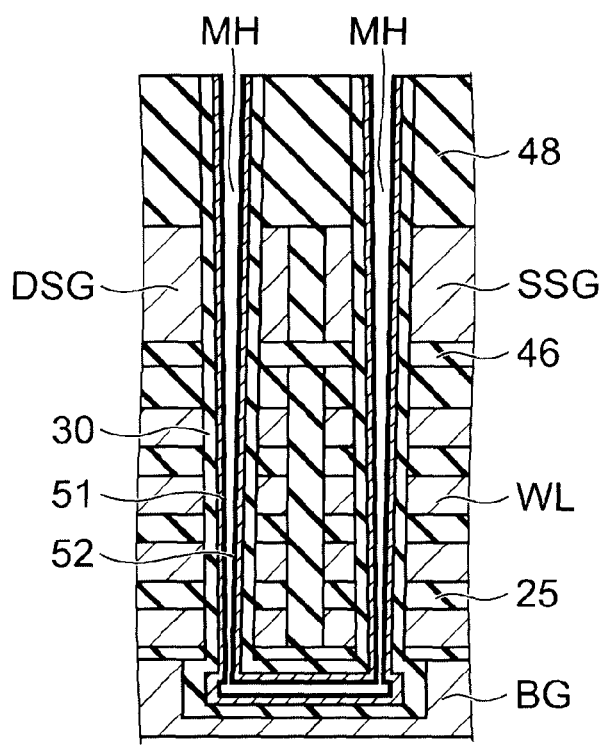

Thus, oxidation of Si proceeds from the inner surface of the SiGe film 51, and as shown in FIG. 5B, a silicon oxide film 52 is formed on the hollow portion side of the SiGe film 51. Here, Ge dissociated from coupling with Si on the hollow portion side diffuses to the memory film 30 side while terminating crystal defects in the SiGe film 51 and recrystallizing it, and is concentrated on the memory film 30 side. Thus, a SiGe channel with high Ge concentration and high mobility is formed on the memory film 30 side of the SiGe film 51.

If the memory hole MH includes sites occluded and not occluded by the silicon oxide film 52 due to, for instance, variation in the hole diameter of the memory hole MH, then the body 20 is subjected to local stress, or deformation in shape and size, which may lead to variation in device characteristics.

Thus, in the aforementioned thermal oxidation treatment, it is preferable to establish various conditions so that the hollow portion of the memory hole MH is not filled with the silicon oxide film 52. For instance, by setting the hole diameter of the memory hole MH to 60 nm, the film thickness of the memory film 30 to 20 nm, and the film thickness of the SiGe film 51 to 7 nm, a silicon oxide film 52 with a film thickness of 2 nm is formed by thermal oxidation, and a hollow portion with a hole diameter of 2 nm is left inside it.

Here, because SiGe has a lower melting point than Si, even if the aforementioned thermal oxidation treatment is performed as thermal oxidation at e.g. 1200° C., polycrystalline silicon constituting the conductive layer WL does not soften or melt. This enables alteration of only the SiGe channel without varying the shape and size of the stacked body.

The aforementioned process for altering the SiGe film 51 to form a channel with high Ge concentration on the memory film 30 side is not limited to heat treatment in an oxygen atmosphere. However, it is known that thermal oxidation treatment can alter the SiGe film 51 more efficiently and stably.

Figure 6A:
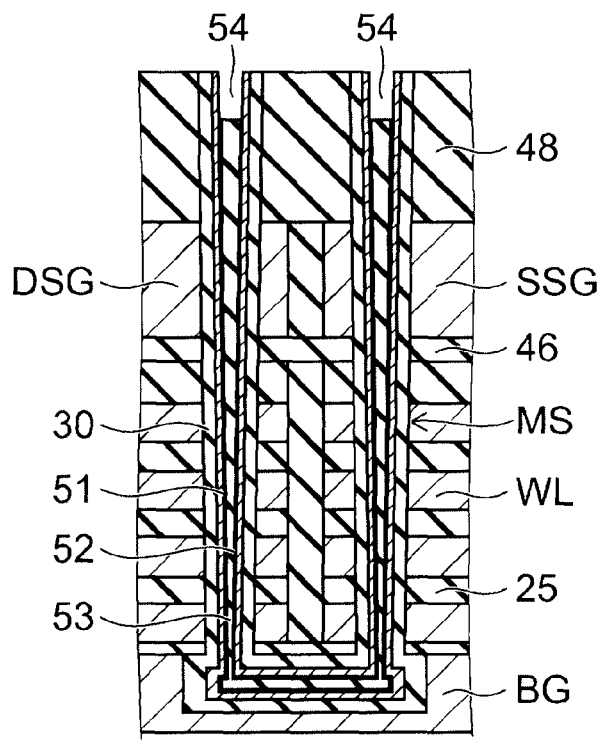

Next, as shown in FIG. 6A, silicon nitride is illustratively buried as an insulating core material 53 in the hollow portion. Subsequently, RIE is performed under a condition with etching selectivity between silicon oxide illustratively constituting the insulating layer 48 and SiGe to remove the upper end portion of the insulating core material 53. Thus, a trench 54 is formed in the upper end portion of the memory string MS.

Figure 6B:
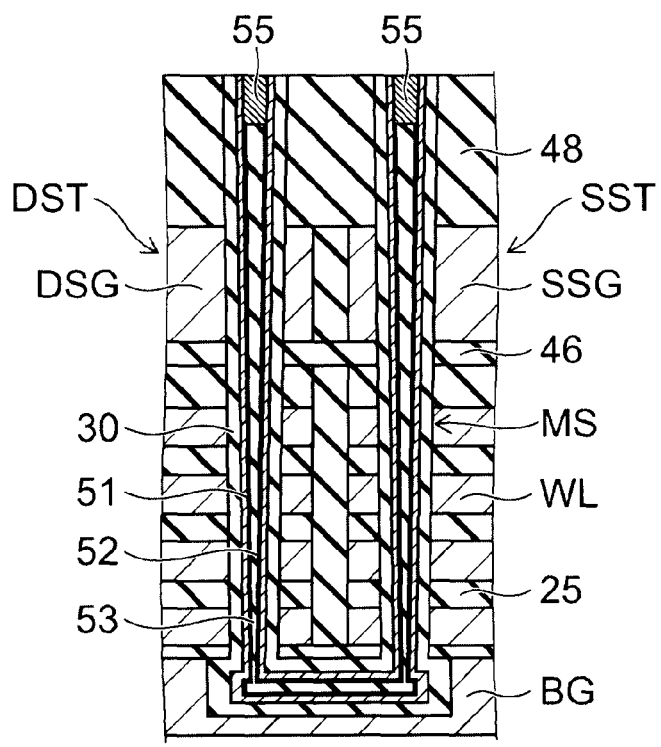

Subsequently, the silicon oxide film 52 exposed into the trench 54 is removed illustratively by wet etching to expose the inner side surface of the upper end portion of the SiGe film 51. Then, amorphous silicon highly doped with phosphorus, for instance, is formed in the trench 54 by the CVD process. Thus, as shown in FIG. 6B, a plug 55 is formed in the upper end portion of the memory string MS. The plug 55 is in contact with the side surface of the upper end portion of the SiGe film 51. The upper end portion of the SiGe film 51 and the plug 55 on the drain-side select gate DSG side are connected to the bit line BL, and upper end portion of the SiGe film 51 and the plug 55 on the source-side select gate SSG side are connected to the source line SL.

In the structure shown in FIG. 6B, also in the portion piercing the drain-side select gate DSG and the portion piercing the source-side select gate SSG, the SiGe film 51 is formed integrally with the SiGe film 51 formed in the memory cell. The portion of the SiGe film 51 opposed to the drain-side select gate DSG functions as a channel film of the drain-side select transistor DST, and the portion of the SiGe film 51 opposed to the source-side select gate SSG functions as a channel film of the source-side select transistor SST. Furthermore, the memory film 30 between the drain-side select gate DSG and the SiGe film 51 functions as a gate insulating film of the drain-side select transistor DST, and the memory film 30 between the source-side select gate SSG and the SiGe film 51 functions as a gate insulating film of the source-side select transistor SST.

Next, a method for manufacturing a semiconductor memory device according to a second embodiment is described with reference to FIGS. 7A to 9B.

Figure 7A:
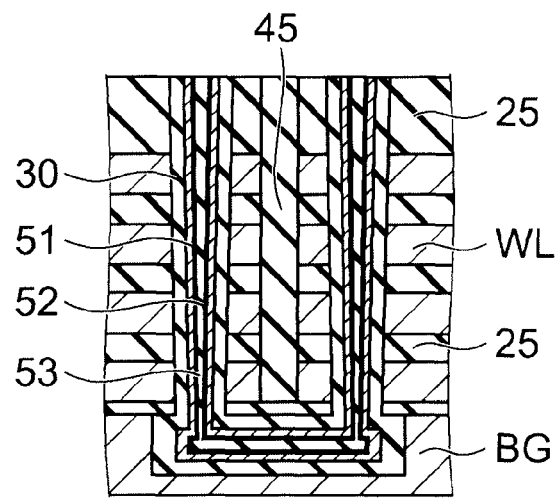
FIGS. 7A to 9B are schematic cross-sectional views showing a method for manufacturing a semiconductor memory device according to a second embodiment.

Also in this embodiment, as in the aforementioned embodiment, a U-shaped memory hole is formed in a stacked body including a back gate BG and a plurality of conductive layers WL, and a memory film 30, a SiGe film 51, a silicon oxide film 52, and an insulating core material 53 are formed in the memory hole. As in the aforementioned embodiment, by thermal oxidation treatment, the memory film 30 side of the SiGe film 51 is turned into a SiGe channel with relatively high Ge concentration. This state is shown in FIG. 7A. However, in this embodiment, a select gate has yet to be formed at this point.

Figure 7B:
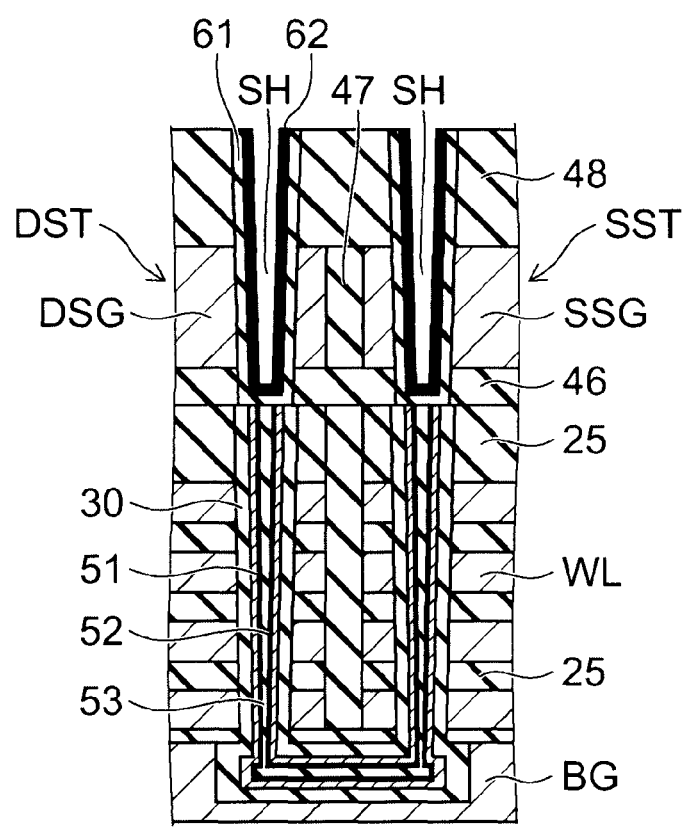

Next, on the stacked body shown in FIG. 7A, an insulating layer 46 and a select gate are stacked as shown in FIG. 7B. Furthermore, the select gate is patterned to form a drain-side select gate DSG and a source-side select gate SSG. Moreover, an insulating layer 48 is stacked thereon.

Subsequently, the RIE process is illustratively used to form a hole SH punched through the insulating layer 48, the drain-side select gate DSG, the source-side select gate SSG, and the insulating layer 46 to the upper end portion of the U-shaped string provided below the insulating layer 46. Then, a gate insulating film 61 is formed on the inner wall of the hole SH, and a spacer film 62 different in material from the gate insulating film 61 is further formed inside the gate insulating film 61.

For instance, the gate insulating film 61 is a silicon nitride film, and the spacer film 62 is a silicon oxide film. The gate insulating film 61 opposed to the drain-side select gate DSG functions as a gate insulating film of the drain-side select transistor DST, and the gate insulating film 61 opposed to the source-side select gate SSG functions as a gate insulating film of the source-side select transistor SST.

Figure 8A:
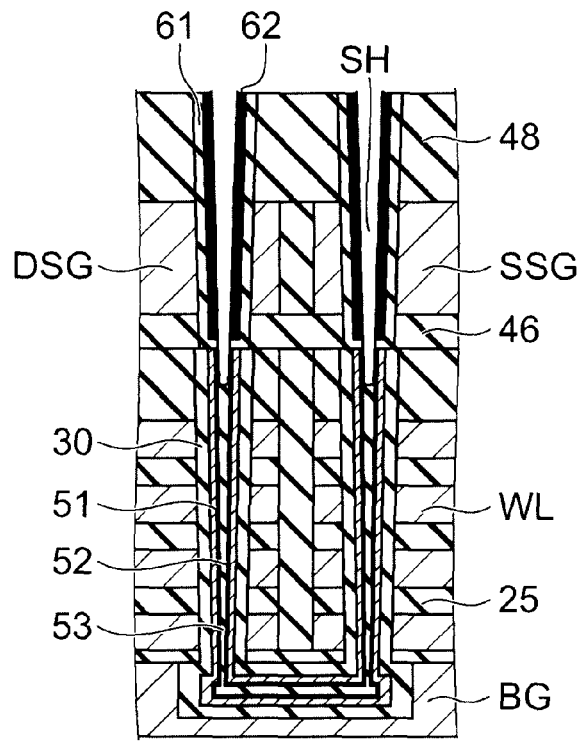

Next, as shown in FIG. 8A, the bottom portion of the spacer film 62 is removed illustratively by the RIE process. Subsequently, the bottom portion of the gate insulating film 61 is further removed by the RIE process. Here, because the side surface of the gate insulating film 61 is covered with the spacer film 62 different in material from the gate insulating film 61, the side surface of the gate insulating film 61 is not etched, and not damaged. After the etching of the bottom portion of the gate insulating film 61, the upper end portion of the insulating core material 53 therebelow is etched back by e.g. approximately 20 nm.

Figure 8B:
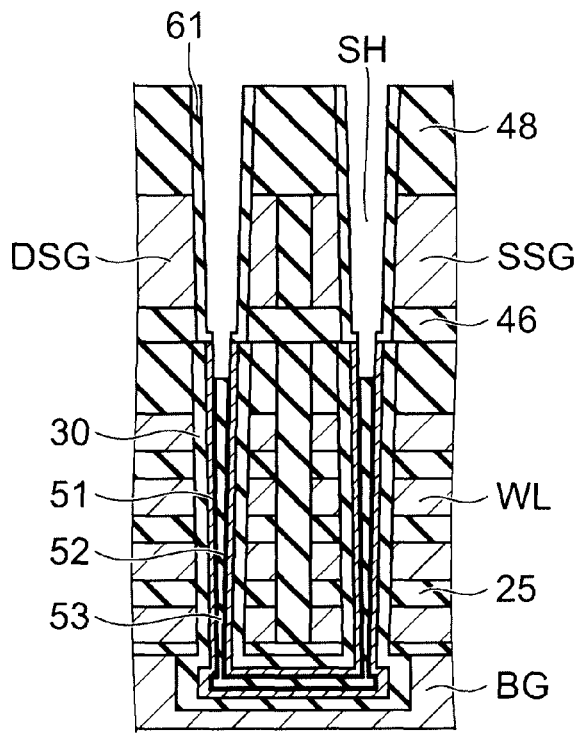

Next, the spacer film 62 and the silicon oxide film 52 formed on the side surface of the upper end portion of the SiGe film 51 exposed by etch back of the insulating core material 53 are removed illustratively by wet etching. Thus, as shown in FIG. 8B, the side surface of the upper end portion of the SiGe film 51 is exposed.

Figure 9A:
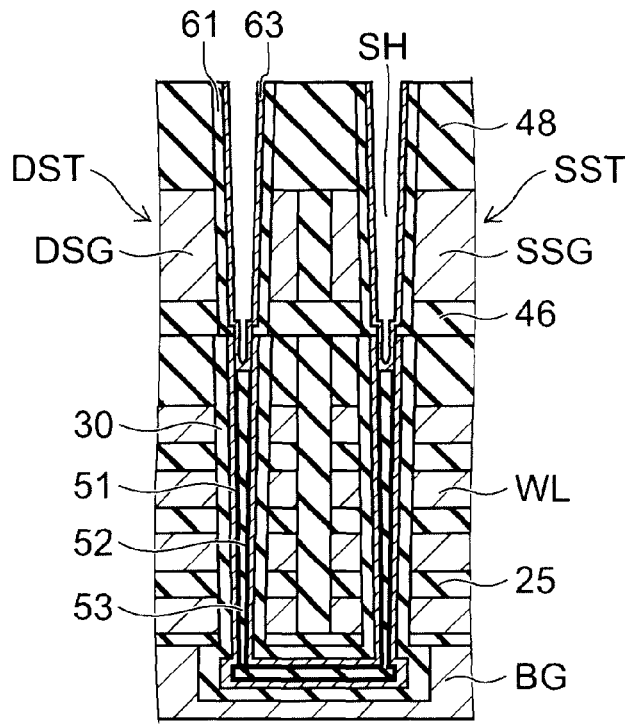

Next, as shown in FIG. 9A, on the sidewall of the hole SH and the side surface of the upper end portion of the SiGe film 51 exposed below the hole SH, an amorphous silicon film is illustratively formed as a channel film 63 of the select transistor (drain-side select transistor DST, source-side select transistor SST). The lower end portion of the channel film 63 is in contact with the side surface of the upper end portion of the SiGe film 51 serving as a channel film of the memory cell, and in this portion, the channel film 63 is electrically connected to the SiGe film 51.

Figure 9B:
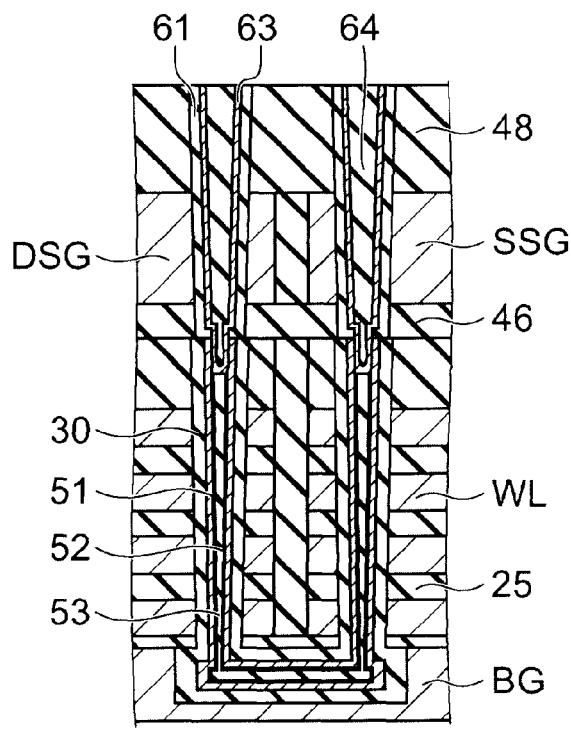

Subsequently, as shown in FIG. 9B, silicon nitride is illustratively buried as an insulating core material 64 in the hollow portion inside the channel film 63. The upper end portion of the channel film 63 on the drain-side select gate DSG side is connected to the bit line BL, and the upper end portion of the channel film 63 on the source-side select gate SSG side is connected to the source line SL.

Because the band gap of Ge is narrower than the band gap of Si, there is concern that off-leak tends to increase in the transistor with the channel made of SiGe. However, in this embodiment, silicon rather than SiGe is used for the channel of the select transistor (drain-side select transistor DST, source-side select transistor SST). This improves the cutoff characteristics of the select transistor, and off-leak at read time can be reduced.

That is, the on-current Ion can be increased by using SiGe for the channel in the memory cell, and the cutoff characteristics of the select transistor can be improved to suppress the off-leak current Ioff by using silicon for the channel in the select transistor. Consequently, the Ion/Ioff ratio at read time is increased, and the read performance can be improved.

Figure 10:
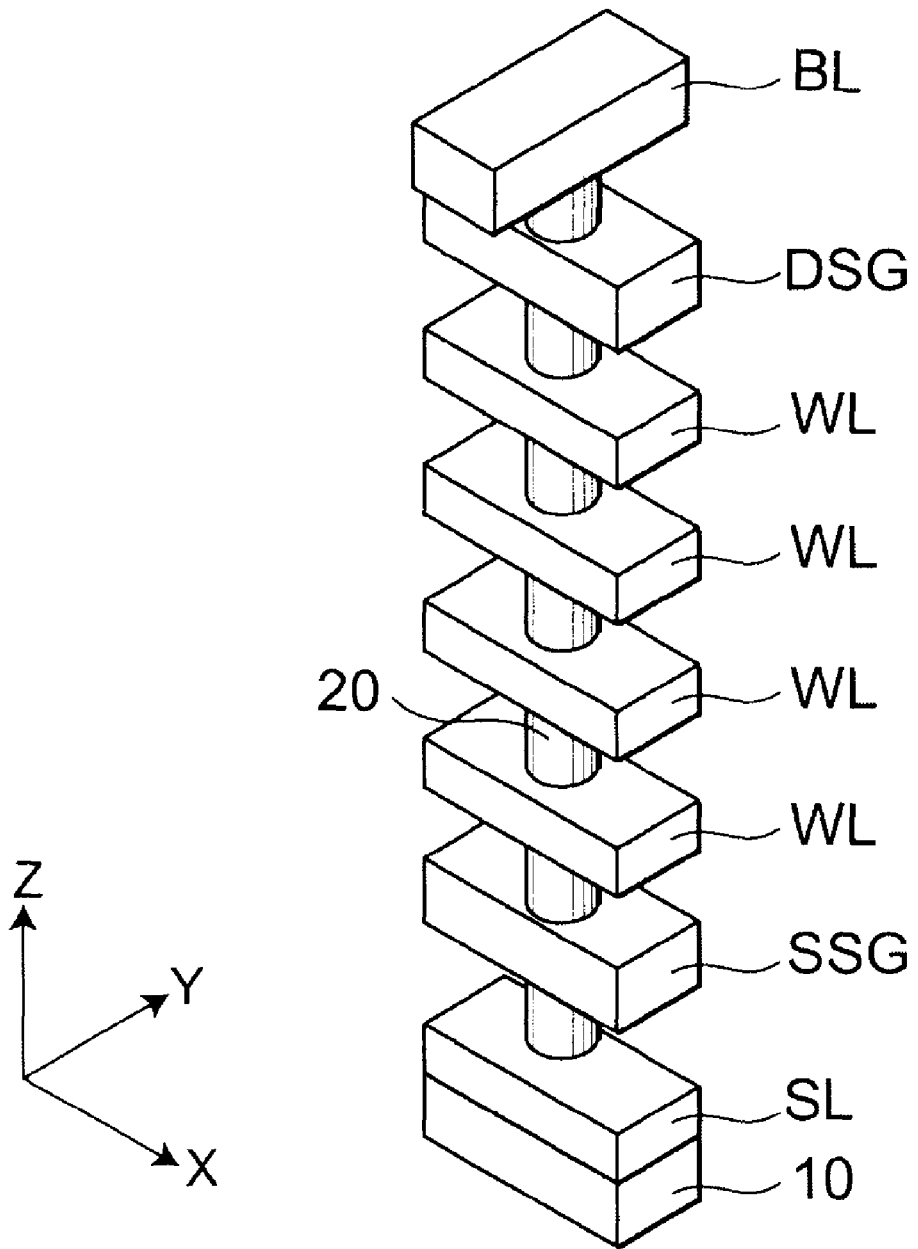
FIG. 10 is a perspective view showing another specific example of a memory string in the semiconductor memory device according to the embodiment.

The configuration of the memory string is not limited to the U-shape, but may be an I-shape as shown in FIG. 10, which shows only the conductive portions, and omits the insulating portions. In this structure, a source line SL is provided above a substrate 10, a source-side select gate (or lower select gate) SSG is provided above the source line SL, a plurality of conductive layers WL are provided above the source-side select gate, and a drain-side select gate (or upper select gate) DSG is provided between the uppermost conductive layer WL and a bit line BL. Also in this case, the channel resistance can be reduced by using the aforementioned SiGe film 51 as a channel film in the body 20.

While certain embodiments have been described, these embodiments have been presented by way of example only, and are not intended to limit the scope of the inventions. Indeed, the novel devices and methods describes herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A semiconductor memory device comprising:
   a substrate;
   a stacked body including a plurality of conductive layers and a plurality of insulating layers alternately stacked above the substrate;
   a memory film including a charge storage film and provided on a sidewall of a memory hole punched through the stacked body; and
   a SiGe film provided inside the memory film in the memory hole, the SiGe film having a relatively high Ge concentration on a central axis side of the memory hole.

2. The device according to claim 1, further comprising:
   a silicon oxide film provided on a side surface of the SiGe film on an opposite side to the memory film.

3. The device according to claim 1, further comprising:
   a select gate stacked on the stacked body;
   a gate insulating film provided on a side surface of a hole punched through the select gate immediately above the memory hole; and
   a channel film provided inside the gate insulating film in the hole.

4. The device according to claim 3, wherein the channel film is a SiGe film provided integrally with the SiGe film.

5. The device according to claim 3, wherein the channel film is a silicon film.

6. The device according to claim 5, wherein the silicon film is in contact with a side surface of an upper end portion of the SiGe film.

7. The device according to claim 5, wherein the gate insulating film is a silicon nitride film.

* * * * *